US009745788B2

(12) United States Patent
Becker et al.

(10) Patent No.: US 9,745,788 B2
(45) Date of Patent: Aug. 29, 2017

(54) DOOR DEVICE FOR A HOUSEHOLD APPLIANCE, HOUSEHOLD APPLIANCE COMPRISING SUCH A DOOR DEVICE AND METHOD FOR ACTUATING A DOOR DEVICE FOR A HOUSEHOLD APPLIANCE

(75) Inventors: Jeremy Becker, Petit Ebersviller (FR); Gael Mollet, Duttlenheim (FR); Pierre Steiner, Wasselonne (FR)

(73) Assignee: BSH Hausgeräte GmbH, Munich (DE)

( * ) Notice: Subject to any disclaimer, the term of this patent is extended or adjusted under 35 U.S.C. 154(b) by 412 days.

(21) Appl. No.: 13/499,322

(22) PCT Filed: Oct. 1, 2010
(Under 37 CFR 1.47)

(86) PCT No.: PCT/EP2010/064680
§ 371 (c)(1),
(2), (4) Date: Dec. 20, 2012

(87) PCT Pub. No.: WO2011/039362
PCT Pub. Date: Apr. 7, 2011

(65) Prior Publication Data
US 2013/0119838 A1    May 16, 2013

(30) Foreign Application Priority Data
Oct. 2, 2009   (EP) ..................... 09290772

(51) Int. Cl.
*E05F 15/00*   (2015.01)
*E05F 15/73*   (2015.01)
(Continued)

(52) U.S. Cl.
CPC .............. *E05F 15/73* (2015.01); *F24C 15/02* (2013.01); *G01R 27/2605* (2013.01); *E05Y 2900/308* (2013.01)

(58) Field of Classification Search
CPC ....... G01R 27/2605; E05F 15/73; F24C 15/02
See application file for complete search history.

(56) References Cited

U.S. PATENT DOCUMENTS 4,608,780 A * 9/1986 Van Noy .................... 49/400
5,476,318 A * 12/1995 Yingst ............... E05B 1/0015
312/405
(Continued)

FOREIGN PATENT DOCUMENTS

CN    2704005 Y    6/2005
DE    3438342    * 10/1984 ............. E05B 65/20
(Continued)

OTHER PUBLICATIONS

International Search Report PCT/EP2010/064680.
(Continued)

*Primary Examiner* — Jeff Natalini
(74) *Attorney, Agent, or Firm* — Michael E. Tschupp; Andre Pallapies

(57) ABSTRACT

A door device for a household appliance includes a door having in particular a first vertical longitudinal side, a second vertical longitudinal side disposed opposite the first longitudinal side, and a top side extending between the longitudinal sides The door device further includes a door opening device for automatically opening the door, wherein a handle element is designed in particular on the second longitudinal side and/or a handle element is designed in particular on the top side. The door has at least one detection sensor, which is designed to detect a finger in a detection region around or on the handle element, and a control unit, which is designed to control the door opening device in response to information received from the detection sensor.

43 Claims, 2 Drawing Sheets

(51) Int. Cl.
*G01R 27/26* (2006.01)
*F24C 15/02* (2006.01)

(56) References Cited

U.S. PATENT DOCUMENTS

| | | | | |
|---|---|---|---|---|
| 5,822,925 | A | * | 10/1998 | McKinney et al. ............ 49/386 |
| 5,857,720 | A | * | 1/1999 | Kim ................................ 292/98 |
| 6,307,182 | B1 | | 10/2001 | Lile |
| 2003/0168447 | A1 | * | 9/2003 | Lee ..................... H05B 6/6435 219/722 |
| 2004/0240196 | A1 | * | 12/2004 | Wilsdorf ............... F24C 15/008 362/89 |
| 2006/0107597 | A1 | | 5/2006 | Jin et al. |
| 2006/0162254 | A1 | * | 7/2006 | Imai et al. ......................... 49/26 |
| 2006/0191921 | A1 | * | 8/2006 | Cho et al. ..................... 219/739 |
| 2006/0232378 | A1 | * | 10/2006 | Ogino et al. ................ 340/5.62 |
| 2007/0018790 | A1 | * | 1/2007 | LaFrance ................ B60R 25/10 340/5.72 |
| 2007/0113523 | A1 | * | 5/2007 | Baptista ......................... 53/434 |
| 2007/0267402 | A1 | | 11/2007 | Harned et al. |
| 2008/0282504 | A1 | | 11/2008 | Baumeister et al. |
| 2008/0288113 | A1 | | 11/2008 | Nishio |
| 2009/0256677 | A1 | * | 10/2009 | Hein et al. .................. 340/5.72 |
| 2010/0007463 | A1 | * | 1/2010 | Dingman et al. ............ 340/5.72 |
| 2010/0024302 | A1 | * | 2/2010 | Kakuyama et al. .............. 49/31 |
| 2011/0139772 | A1 | * | 6/2011 | Darney ............... E05B 47/0002 219/702 |

FOREIGN PATENT DOCUMENTS

| | | | |
|---|---|---|---|
| DE | 10235361 A1 | 10/2003 | |
| DE | 202006016122 U1 | 12/2007 | |
| DE | 102006029902 A1 | 1/2008 | |
| GB | WO 2007/147628 | * 12/2007 | ............... H05B 6/80 |
| JP | 8232529 A | 9/1996 | |
| JP | 2001033150 | 2/2001 | |
| JP | 2005326044 A | 11/2005 | |
| KR | 1019990005836 | 1/1999 | |
| WO | 2006133998 A1 | 12/2006 | |
| WO | 2008071521 A2 | 6/2008 | |
| WO | 2010139536 A1 | 12/2010 | |

OTHER PUBLICATIONS

Report of Examination including National Search Report CN 201080043964 dated Nov. 5, 2013.
Report of Examination EP 10 765 411.3 dated Apr. 8, 2015.

* cited by examiner

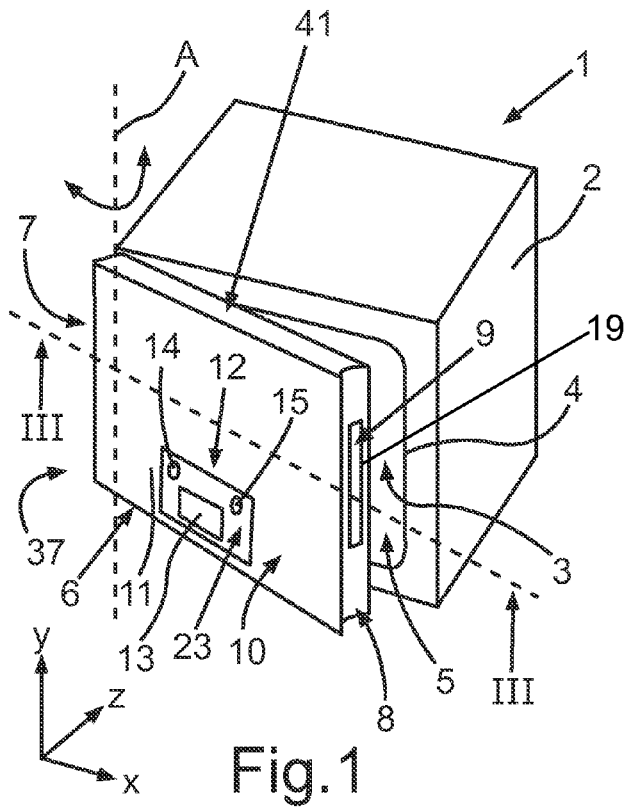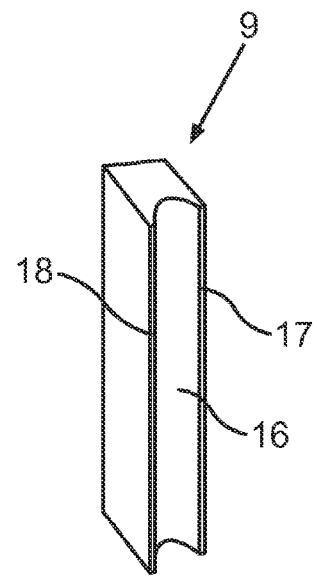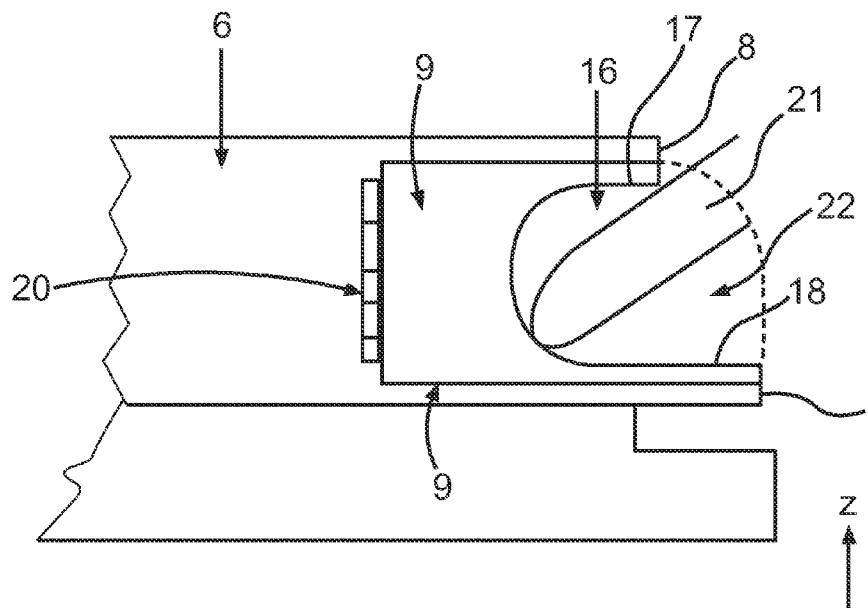

DOOR DEVICE FOR A HOUSEHOLD APPLIANCE, HOUSEHOLD APPLIANCE COMPRISING SUCH A DOOR DEVICE AND METHOD FOR ACTUATING A DOOR DEVICE FOR A HOUSEHOLD APPLIANCE

BACKGROUND OF THE INVENTION

The invention relates to a door device for a domestic appliance comprising a door, a handle element and a door-opening device for automatic opening of the door. The invention further relates to a domestic appliance, in particular an oven, having a door device of this type, and a method for actuating a door device for a domestic appliance.

Door devices for domestic appliances, for example, ovens, microwave devices, freezers, refrigerators or the like are known in many forms. In this context, the doors are provided for closing a cooking chamber or other storage chamber. Doors are known, in this context, which have at the front, on a front panel, at least one handle element which can be grasped by a user and can be manually actuated so that the door can be opened. Such handle elements usually project forwardly such that they require space and such that a user could collide therewith. Furthermore, such exclusively manually actuated handle elements require the application of a relatively large force to ensure opening.

Automatic door-opening devices are also known in the context of door devices for opening the door. For example, it is provided that by pressing an actuating element or an opening button, the door is unlocked and automatically opened, or springs open. Should said actuating mechanism or the electronics required therefor fail, opening can then only be performed by a service engineer or a customer service person. Furthermore, with electronic door-opening devices of this type which can be actuated by a user via an operating button arranged at the front side, no further actual handle element is provided. Operation is therefore user-unfriendly. Therefore for complete opening, the user must touch the front panel or the regions of the door not primarily provided for grasping, and fully open the door. In this way, the door becomes dirtied with finger marks and the like and must therefore also be frequently wiped and cleaned for hygiene reasons.

The conventional electronically controlled door-opening devices also have a very complex structure and a relatively long reaction time.

BRIEF SUMMARY OF THE INVENTION

It is an object of the present invention to provide a door device for a domestic appliance, and a domestic appliance of this type having a door device, as well as a method for actuating a door device by means of which the opening times during automatic opening are reduced, in addition to which, user-friendliness is assured with regard to adequate gripping reliability and a space-saving construction of the door device.

This aim is achieved with a door device for a domestic appliance, said door device comprising a door; a handle element; a door-opening device for automatic opening of the door; at least one detection sensor configured for detecting a finger in a detection region around or at the handle element; and a control unit configured to control the door-opening device based on information from the at least one detection sensor. This aim is also achieved with a domestic appliance (particularly an oven) comprising a door device with the above features and a method for actuating the door device.

The door device according to the invention for a domestic appliance comprises a door and a handle element for gripping when the door is moved by a user. The door device also comprises a door-opening device for automatic opening of the door. The door comprises at least one detection sensor configured for detecting a finger in a detection region around or at the, or one, handle element, and a control unit is provided which is configured dependent on the information from the detection sensor for controlling the door-opening device.

The door is preferably configured with a first vertical longitudinal side, a second vertical longitudinal side arranged opposite the first vertical longitudinal side and an upper side extending between the longitudinal sides. In particular, a handle element is provided at the second longitudinal side and/or at the upper side.

In very particular positioning, the handle element is not mounted at the front side of the door, but in a manner partially reducing the structural volume and space used, at the second vertical longitudinal side and/or at the upper side. Since the door has a particular thickness, said second longitudinal side and/or the upper side and the associated thickness is suitable for accommodating the handle element, so that the thickness of the door is not altered by the handle element. One longitudinal side is therefore defined by the surface which results from the thickness of the door extending rearwardly behind the front surface of the door. This applies similarly to the upper side. In addition, as a result of this particular positioning of the handle element at the longitudinal side and/or the upper side, the risk of persons colliding therewith, as is the case with handle elements which project from the front side forwardly or the like, can be prevented. Furthermore, this particular position of the handle element is also a very user-friendly mounting which practically leads the user to the right place, particularly considering the otherwise intuitively configured opening and handling of the door. Since a handle element is specifically configured for grasping with the fingers, an embodiment can also be created in which unwanted handling or sliding of the fingers or the hand along other parts of the door can be prevented, thereby avoiding soiling thereof by human hands. Not least, with this specific handle element, a highly ergonomic and well-adapted grasping capability is provided which prevents sliding off or the like, so that in this regard also, a user-friendly design for reliable further opening and movement of the door by a user following automatic opening is assured. In a particularly advantageous embodiment, at least one detection sensor is provided with which touching, grasping or at least a finger brought, without contact, into the immediate vicinity of the handle element is very rapidly and directly detected and thus the desire of a user to open the door can be detected quickly and responsively and the door opening device can also be actuated significantly faster. The reaction time of the automatic door-opening device can therefore be significantly reduced, resulting in an opening time of less than 0.5 seconds.

Preferably at least one mounting element can be attached to the first vertical longitudinal side for pivoting the door parallel to the longitudinal side. In particular, therefore, a door device is provided wherein the door is configured for lateral mounting, so that the door can be moved about a vertical longitudinal axis for opening and closing.

Preferably, the handle element is configured as a stable part designed in one piece. It is provided, in particular, that the handle element is arranged locally fixed to the second longitudinal side and/or the upper side and therefore not movable relative to the door. It is therefore not provided that the handle element sets a particular opening mechanism into operation by means of a movement capability relative to the door. The handle element thus serves only for gripping. Preferably, a slit is provided at the second longitudinal side and/or the upper side of the door wherein the handle element is arranged. With such an, at least partially, recessed arrangement, a more space-saving and size-reducing design can be achieved. It can thereby also be mounted mechanically stable.

The handle element is preferably, in particular, a straight bar which has an engagement region, particularly a corner-free channel corresponding to a recessed grip. A design of this type is a particularly ergonomic configuration which enables easy engagement with the fingers and, after automatic opening, for the door to be opened further manually using little force. In this case, also, sliding off and injury or becoming caught can be prevented by the corner-free design. Not least, an adequate handle region can be formed by such a configuration with a relatively shallow recess.

Preferably, a channel limb facing a door front is configured longer than a channel limb facing away from the door front. With this configuration of the limbs or walls having asymmetry in relation to the recess, provision can be made for the most precise and stable possible engagement. This, firstly, enables a larger region in which the fingers can enter the engagement region, so that access to the engagement region is improved. Secondly, the structural depth at the side facing away from the door front can also be lessened so that undesirable impact with other components of the domestic appliance can be prevented.

The handle element is preferably arranged behind a front panel of the door and covered thereby when observing the door from the front. This is a particularly well-protected arrangement such that collision therewith and undesirable wear or damage to the handle element can be prevented. Allowance can also be made thereby for high quality and design requirements, since when observing from the front, the handle element cannot be looked into.

Preferably, the at least one detection sensor is a capacitive sensor. This enables very rapid detection of a finger in a detection region or at the handle element and is also configured functionally relatively robust.

Preferably, at least one electrode of the capacitive sensor is arranged in the door behind the handle element, particularly at the handle element behind an engagement region. By this means, particularly precise and sensitive detection is enabled. Furthermore, with this specific spatial positioning of the electrode, a highly protected and low-wear position is provided. Not least, by means of this position, even with non-destructably releasable attachment of the handle element at the longitudinal side, easy access to the electrode for exchange or servicing purposes is made possible.

Preferably, the handle element is made, at least in the region of the detection sensor, from an electrically non-conductive material.

The detection sensor can also be an inductive sensor or a microswitch.

In particular, the automatic door-opening device is configured with a child safety device. This is a particular advantage, since undesirable opening of the door when a child grasps the handle device can be thereby prevented. Specifically in the case of domestic appliances such as ovens or the like which have relatively high temperatures during operation in the cooking chamber which is closed by the door, a high degree of safety can be provided for children.

The door preferably comprises an operating device provided at the front panel of the door. This door-integrated arrangement of the operating device enables an advantageously compact design and user-friendly arrangement which is clear to see and constantly accessible.

Particularly advantageously, it is provided that the child safety device can be activated and deactivated via the operating device, electronically controlled by the control unit. Said child safety device can therefore be actuated rapidly and reliably. Furthermore, the operating device can comprise a display device by means of which various information can be presented to the user. In that the display unit of the operating unit is also integrated into the door and, in particular, at the front panel, visibility to the user is particularly good. In this context, particularly, the indication of an activated or deactivated child safety device can thus be rapidly and reliably recognized by an adult.

Preferably, the door-opening device can also be actuated via the operating device. Given such a design with redundancy, if the capability for opening via the handle element fails or is not unrestrictedly available, the door can also be opened with the operating device.

This is particularly advantageous if two domestic appliances having such a door-opening device are positioned directly adjacent one another and the two vertical longitudinal sides facing one another lie substantially directly against one another.

Preferably, the activation of the door-opening device, particularly a motor, by the control unit is dependent on detection of an operating state of the domestic appliance, particularly in a non-activated pyrolytic operation of the oven and/or on electronically sensed detection of a locked position of a cam element of a drive device of the door-opening device and/or of a closed door. By this means also, the safety precautions can be enhanced with regard to unwanted opening of the door.

Due to the two possibilities for opening the door, firstly via the handle element and secondly via the operating device, it can be provided that opening is configurable via the operating device and operating elements associated therewith. It is thus possible for user-specific setting of which of the two possibilities for actuating the automatic door-opening device should be used. In this way, customer benefit can be significantly enhanced.

From this standpoint, the control unit of the door device is suitably configured and the configuration individually set by the user can be stored therein until possibly being changed again.

The door-opening device of the door device preferably comprises a door hook which is arranged at the door and which is linearly actuatable by means of a drive device of the door-opening device provided separately from the door and which can be unlocked with a rotary catch arranged on the drive device side for opening the door. The opening can be carried out very reliably and without jamming or spreading by means of linear actuation of the door hook. Since the rotary catch is more complex with regard to the movement thereof, specifically performing a linear and rotary movement, the action on the rotary catch during opening of the door would be more complex. By means of the action on the door hook and the linear movement thereof, the fault-susceptibility of the automatic door-opening device can be significantly reduced.

The invention also relates to a domestic appliance, particularly an oven having a door-opening device according to the invention or an advantageous embodiment thereof.

Advantageous embodiments of the door-opening device according to the invention should be regarded as advantageous embodiments of the domestic appliance.

The invention also relates to a method for actuating a door device for a domestic appliance, comprising a door and a handle element, the door device also having a door-opening device for automatic opening of the door. By means of the method according to the invention, a finger is detected in a detection region around or at a handle element by at least one detection sensor of the door device, and the opening of the door is controlled depending on the information from the detection sensor, controlled by a control unit.

Advantageous embodiments of the door device according to the invention are to be regarded as advantageous embodiments of the method according to the invention.

With regard to the specific embodiment of the door-opening device, said device is configured for automatic opening of the door of the domestic appliance. In particular, the door-opening device comprises a drive motor which is mechanically coupled via an actuating device of the door-opening device to a door hook. The drive motor is connected to a cam element of the actuating device, said cam element having a helical camway against which abuts a transmission element of the actuating device, said transmission element being coupled to the door hook and being able to transmit the movement of the cam element to the door hook. Through a specific embodiment of the door opening device of this type with the specific embodiments of the elements and the cooperation thereof, a rotary movement of the drive motor, in particular the shaft thereof, can be converted into a linear movement of the door hook for opening the door. Due to the highly specific embodiment of the cam element with the helical camway, this movement conversion can be carried out in a particularly jolt-free and even manner, so that here also, undesirable movements can be prevented. The occurrence of high torques or forces acting upon the components during opening can therefore be prevented, so that wear in the door opening device can be significantly reduced. Not least, by means of this helical or wound path of the cam, particularly precise, well-regulated and accurate movement control can be achieved.

The cam element is preferably rotatable about the longitudinal axis thereof by the drive motor and the rotary motion is converted by the helical camway into a linear movement by means of which the door hook can be moved linearly to open the door.

Specifically this arrangement enables an actuating concept wherein the fewest possible components are used and a reliable conversion of the movement directions is achieved through the coupled elements. The linear motion guidance of the door hook enables a more robust and much more freely moving opening function compared with direct action on a rotary catch of the door-opening device. Jamming, spreading or unwanted twisting can thereby be prevented and blocking of opening of the door can be prevented.

Preferably, the rotary position of the cam element is detectable by an electronic switch. The motion guidance can thus be achieved more precisely with regard to accurate control.

The door can also be opened manually at any time. In this way, for example in the event of a power failure, the door can be opened and safety-critical states can be prevented.

The cam element preferably has a first rotary position interval. If the cam element is in said first rotary position interval relative to a position detection switch, a position of the cam element is detected which permits complete closing of the door. Since the cam element is coupled to the motor, a position of the motor in which said motor has reached the effective home position thereof is also thereby detected. The motor is therefore rotated backwardly until the home position thereof is reached again, in particular after opening of the door, so that then at some subsequent time, the opened door can be completely closed again manually. In this way, stringent safety requirements are taken into account, since the motor and thus also the cam element do not remain in an undesirable position in which complete closing of the door would not be possible. Precisely when this position is such that a user cannot immediately detect whether the door is completely closed or not, safety-critical states could arise, for example, during pyrolytic operation of an oven. Such states are prevented by this embodiment.

It is particularly preferably provided that reverse rotation of the motor and of the cam element from the end position into the home position or zero position takes place such that further rotation occurs in the direction in which the cam element was moved from the home position into the end position. This means that the motor shaft is only ever further rotated in one direction. When the cam element is transferred from the home position into the end position, rotation occurs in the same direction as during a subsequent transfer from the end position to the home position. As a result of this single rotation direction possibility for the motor and the cam element, control of the motor can be achieved with the control unit substantially more simply and thus also with less effort and less likelihood of errors.

Preferably an elevation is provided at an external side of the cam element, said elevation being detectable by an electronic switch for detecting the rotary position of the cam element. By means of this elevation at the outer surface of the cam element and the electronic switch placed spaced apart therefrom, this change in the outer surface can be detected and the rotary position of the cam element can be reliably determined at any time.

Not least, with this specific embodiment for position recognition, a very robust, component-reducing embodiment can be achieved, which is also particularly compactly designed. The configuration of the elevation is carried out essentially by single-part design of the cam element so that the elevation is configured and arranged positionally stable and also subject to low wear.

This results, not least, in a design requiring few components.

Preferably, the cam element has a second rotary position interval. This second rotary position interval extends, in particular, from the first rotary intermediate position to an end position. In particular, therefore, two rotary position intervals or zones are thus formed over the whole rotary movement range of the element.

Preferably, the length of the camway covered by the second rotary position interval is substantially longer, particularly multiple times longer, than the length of the camway covered by the first rotary position interval. Such specific length dimensioning takes account of the precisely controlled movement of the transmission element on the camway and enables the very precise detection of positions to complete closing of the door.

Preferably, the combined lengths of the rotary position intervals of the helical camway amount to a complete rotation about the longitudinal axis of the cam element. The rotary capability of the cam element about the rotation axis thereof therefore preferably corresponds to a single complete rotation. With a configuration of this type, it is possible, in particularly advantageous manner, for excessively rapid rotary movements with regard to the full linear motion of the door hook to be rendered unnecessary, so that slipping of the transmission element from the camway can be prevented. Furthermore, with this embodiment, wear can be kept particularly low and a particularly controlled and jolt-free movement of the door hook can be assured.

The smallest possible torques are thereby produced so that the interaction of the components can be carried out with particularly low wear.

Preferably, the transmission element comprises a ball bearing. It is also provided that a longitudinal ball bearing is arranged between a motor support and the cam element. By means of this arrangement and the specific embodiment with a longitudinal ball bearing, the occurrence of axial forces on the drive shaft of the motor can be prevented. The radial force on the drive shaft of the motor is therefore also very small.

In particular, only the door hook is arranged at the door and the other components of the door-opening device are arranged at the domestic appliance and not at the door. Preferably, the components not arranged at the door are arranged at a lower closure of the domestic appliance for opening and closing the door. In particular, when the door is opened, a locked state between the door hook and a rotary catch is releasable by means of the linear movement of the door hook.

The door-opening device functions, in particular, such that the drive motor is controlled by the control unit and the cam or cam element coupled to the drive shaft of the motor rotates accordingly. As a result of this rotary movement, the helical camway also rotates and a transmission element in contact therewith, particularly a ball bearing, rolls along said helical camway. Said ball bearing is fastened to a plunger which presses directly against the door hook, the plunger being displaced in the housing of the door-opening device. By this means, the door hook is displaced in a purely linear direction and the locked state is released with a rotary catch. It is also provided that the drive motor can be stopped rapidly by being short-circuited. This enables good cam position adjustment, since the system reacts very rapidly and has practically no overrun. Very rapid deactivation can also be achieved if, for example, the door is blocked by, for example, being held closed or if a person leans thereagainst. The electrical supply to the motor can be limited or the current in the motor can be limited, for example, by a series resistance. By this means, damage to the motor can be prevented and rapid stopping enabled at any time.

Further features of the invention are disclosed by the claims, the figures and the associated description of the figures. The features and combinations of features disclosed above in the description and in the description of the figures below and/or the features and combinations of features shown in the figures alone are usable not only in the respective combination given, but also in other combinations or alone, without departing from the scope of the invention.

BRIEF DESCRIPTION OF THE DRAWINGS

An exemplary embodiment of the invention will now be described in greater detail, making reference to the schematic drawings, in which:

FIG. 1 is a perspective representation of a domestic appliance according to the invention with the door open;

FIG. 2 is a perspective representation of a handle element of a door device;

FIG. 3 is a schematic sectional representation of the door of FIG. 1 in the region of the handle element;

DETAILED DESCRIPTION OF EXEMPLARY EMBODIMENTS OF THE PRESENT INVENTION

Figure 4:
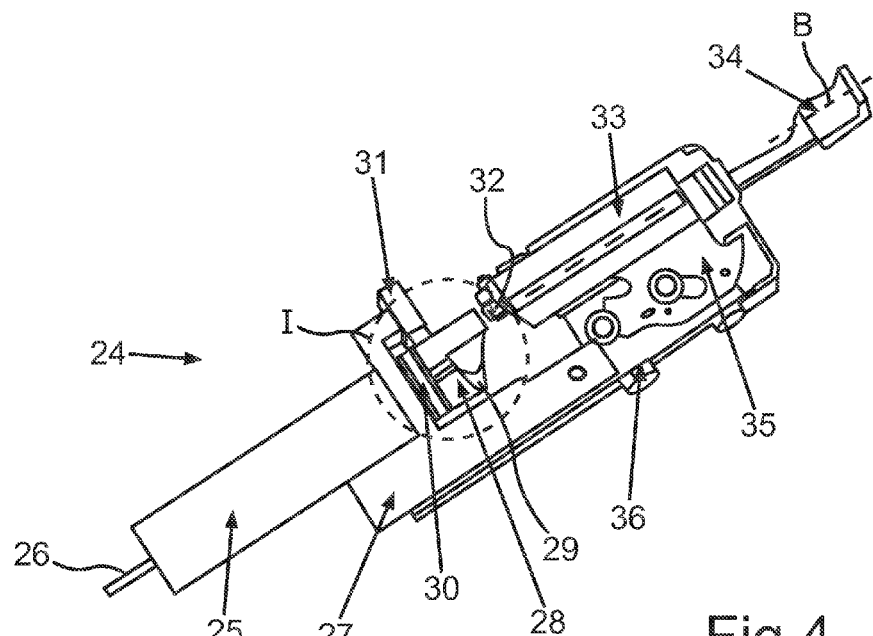
FIG. 4 is a perspective representation of an exemplary embodiment of a door-opening device.

In the figures, the same or functionally similar elements are identified with the same reference signs.

FIG. 1 shows a simplified perspective representation of an oven 1 comprising a housing 2. Provided in the housing 2 is a cooking chamber 3 delimited by a muffle 4. A front loading aperture 5 is closable by a door 6. The door 6 is shown in the opened state. The door 6 is pivotable about a vertical longitudinal axis A as shown by the arrows. The door 6 has a first vertical longitudinal side 7 at which mounting elements are arranged, by means of which the door 6 is fastened to the housing 2 and is movable relative to the housing 2. Furthermore, the door 6 has a second vertical longitudinal side 8 arranged opposing the first vertical longitudinal side 7 in which, in the exemplary embodiment, a handle element 9 is provided. The door 6 also comprises an upper side 41. It can be provided that a further additional handle element is provided at said upper side 41 or that, optionally, the handle element 9 is arranged at said upper side 41 and not at the longitudinal side 8. The door 6 also comprises a front panel 10, wherein an operating device 12 is arranged at a front surface 11 of the front panel 10. The operating device 12 comprises a display unit 13 and operating elements 14 and 15 shown merely as examples for the form, position and number thereof. The operating device 12 and the handle element 9 are therefore integrated into the door 6.

FIG. 2 shows a perspective representation of the handle element 9. This is a single-piece straight rail having an engagement region 16. Said engagement region is configured as a corner-free recessed grip or channel, wherein channel limbs 17 and 18 arranged parallel to one another delimit the recessed grip or engagement region 16. In this regard, the handle element 9 is configured asymmetric, since the channel limb 18 facing the front panel 10 is longer, that is, extends further forwardly than the channel limb 17 facing away from the front panel 10.

FIG. 3 shows a schematic representation of a section along the section line III/III of FIG. 1. It is apparent that the handle element 9 is integrated into a slit 19 of the door 6. The handle element 9 is therefore practically integrated into the door 6 and is configured recessed. Provided at the rear side of the handle element 9 is at least one electrode 20 of a capacitive sensor which is a detection sensor. The detection sensor detects whether a finger 21 extends into a detection region 22, delimited by way of example by a dashed line, and/or whether, as shown in FIG. 3, the finger 21 touches the handle element 9. In addition to or instead of the rearward position shown, the electrodes 20 can also be arranged at the handle element 9 or integrated into the door 6.

The information from the detection sensor is transmitted to a control unit 23 (FIG. 1) which can be arranged in the door 6 or in another position in the housing 2, so that, dependent on the information from the detection sensor, the control unit 23 controls a door opening device, by which the door 6 is opened automatically.

If it is detected that one or more fingers 21 are situated within the detection region 22 or a finger 21 is contacting the handle element 9, then no later than the contacting of the handle element 9, it is detected that an opening requirement of a user exists and the control unit can respond very rapidly thereto and the door-opening device can be actuated.

It is also apparent from FIG. 3 that the front panel 10 extends sufficiently far in the x-direction as to be as long as the limb 18 of the handle element 9. Thus, observing the oven 1 from the front and thus also observing the closed door 6 from the front, the handle element 9 is covered by the front panel 10.

The handle element 9 is positioned locally fixed on the door 6 and therefore not movable relative thereto. The handle element 9 is configured from an electrically non-conductive material, particularly in the regions in which one or more electrodes 20 are arranged.

The oven 1 can be actuated via the handle element 9 for automatic door opening or additionally via the operating device 12, wherein for example, a button 14 or 15 is actuated in order to trigger the automatic door-opening device. With this embodiment, the user can also undertake an individual configuration, according to need, as to whether activation and triggering of the automatic opening device should take place via the handle element 9 or via the operating device 12.

It is preferably provided that the drive motor is activated for automatic opening of the door 6 if the handle element 9 is touched when the door is closed 6 and if the pyrolytic operation of the oven 1 is no longer active. It is preferably provided, if the door 6 is already open, that the drive motor is not activated. In this regard, the motor is also deactivated if the handle element 9 is grasped for further opening of the door or for closing the door 6.

It is also provided, in particular, that the oven 1 has a child safety device which can be activated and deactivated via the operating device 12. If the child safety device is activated, actuation of the door-opening device cannot take place automatically through gasping of the handle element 9 in the closed state of the door 6 and the automatic door-opening device also cannot be operated simply by activation of the drive of the automatic door-opening device merely by actuation of an operating element 14 or 15. Only when the child safety device is deactivated again or when specific further multiple combinable actions, for example, actuation of one or more operating elements 14 and 15 in a specific manner are carried out, even with the child safety device switched on, can operation of the automatic door-opening device be achieved.

FIG. 4 shows a perspective representation of an exemplary embodiment of a door-opening device 24. Said device comprises a drive motor 25 having a drive shaft 26. The motor 25 is fastened to a motor support 27. The door-opening device 24 also comprises a cam element 28 which is configured with a hollow cylindrical form and has, at the end thereof facing away from the motor 25, a helical camway 29. The cam element 29 and the motor 25 are mounted by means of a longitudinal ball bearing or an axial ball bearing 30 by which axial forces on the drive shaft 26 are avoided.

Furthermore, the door-opening device comprises an electronic switch 31 which is arranged at the motor support 27. Said switch 31 is arranged adjacent to the cam element 28 and is configured for detecting the rotary positions of the cam element 28 about the rotation axis, which is identical to the axis of the drive shaft 26. Engaging or rolling along the camway 29 is a transmission element 32 which is configured as a ball bearing. Said transmission element 32 is connected or fastened to a plunger 33. The plunger 33 interacts mechanically with a door hook 34. The door hook 34 is connected to a rotary catch 35 to create a locked state of the door 6. The plunger 33, the motor support 27, the rotary catch 35 and possibly also further components are arranged in a housing 36 of the door-opening device 24. By means of this conceptual configuration of the door-opening device 24, a rotary movement of the motor 25, in particular the drive shaft 26, can be transmitted to the cam element 28 and, due to the specific design of the cam element 28 with the helical camway 29, said rotary movement can be converted into a linear movement of the plunger 33 and thus also of the door hook 34. The door hook 34 is therefore only moved linearly in the direction of the axis B.

Figures 5, 6:
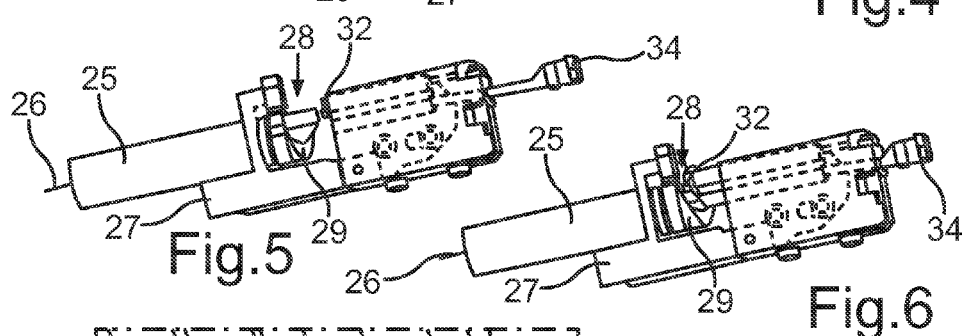
FIG. 5 is a perspective view from beneath of the door-opening device of FIG. 4.
FIG. 6 is a representation of the door-opening device from beneath in the home position of the cam element.

FIG. 5 shows a perspective representation of the door-opening device 24 from beneath. A first operating position is shown, specifically the end position of the cam element 28 wherein the transmission element 32 has reached the upper end of the camway 29, similarly to the representation in FIG. 4.

FIG. 6 shows, in a similar representation to FIG. 5, a perspective view of the door-opening device 24 from beneath, illustrating a further operating state. In FIG. 6, the home position of the cam element 28 is shown, where the transmission element 32 has reached the lowest position of the camway 28.

The motor 25 is electrically connected to the control unit 23 and is controlled thereby.

The control unit 23 and the door opening device 24 belong to the door 6 of a door device 37 (FIG. 1).

Figure 7:
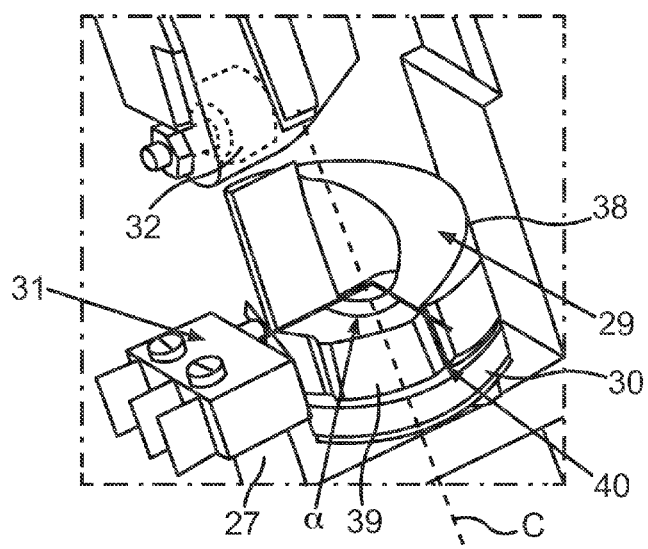
FIG. 7 is an enlarged representation of a partial section of the door-opening device of FIG. 4.

FIG. 7 shows an enlarged section I of the representation in FIG. 4. The representation is somewhat rotated relative to the view in FIG. 4. Both the switch 31 at the motor support 27 and the specific position relative to the cam element 28 are apparent. The cam element 28 is rotatable about the longitudinal axis C thereof by means of the coupling to the drive shaft 26 wherein only one full rotation is performed about the axis C between the starting position or home position and the end position. An elevation 39 is formed at an outer surface 38 of the cam element 28. Said elevation 39 extends, in the peripheral direction, from the starting position shown in FIG. 7 to an end 40. Said end 40 also defines the end of a first rotary position interval which extends from the starting position to this rotary intermediate position defined by the end 40. This zone or rotary position interval is represented by the lines which are drawn in merely by way of example, to indicate the limits of the first rotary position interval and thus the angular region $\alpha$, and are not shown in the actual embodiment. Within said angular region $\alpha$ which denotes the first rotary position interval, the switch 31 can precisely detect this position by detecting the elevation 39. Provided the cam element 28 is positioned within said first rotary position interval relative to the detection region of the switch 31, the home position of the motor 25 is detected and further movement of the motor 25 is halted. In this position of the motor 25 and thus also of the cam element 28, it is reliably ensured that the door 6 can be completely closed again manually. If the cam element 28 is positioned outside said first rotary position interval and is therefore in a rotary position between the rotary intermediate position which begins at the end of the angular region $\alpha$, and an end position of the cam element 28 (second rotary position interval), complete closing of the door cannot take place. The motor 25 is then brought into the home position, which again is detected by means of the cam element 28 and the switch 31. Rotation of the cam element 28 and of the motor 25 too far or insufficiently far can thereby be prevented. This positioning of the cam element 28 and the motor 25 within the first rotary position interval prevents the transmission element 32 from contacting the camway 29 too soon during closing of the door 6 and thus during movement of the door hook 34 in the direction of the cam element 28 and being prevented from moving further. The length of the camway 29 in the first rotary position interval, denoted by the angular region α, is significantly shorter than the partial section of the camway 29 over which the second rotary position interval extends.

Only the door hook 34 can be fastened to the door 6, whereas the further components in the housing 2 are arranged separately from the door 6. The door-opening device 24 is configured at a lower closure of the door 6.

The elevation 39 effectively causes the switch 31 to be switched on and thereby the first rotary position interval to be detected. The motor 25 is stopped on receiving information concerning, for example, a pulse flank from the switch 31. The switch 31 detects the angular position of the cam element 28. In order to be able to stop the motor 25 rapidly, for example when the automatic door opening occurs unintentionally by being held closed or because a user leans thereagainst, the motor 25 is short-circuited.

REFERENCE SIGNS

1 Oven
2 Housing
3 Cooking chamber
4 Muffle
5 Loading aperture
6 Door
7, 8 Longitudinal sides
9 Handle element
10 Front panel
11 Front surface
12 Operating device
13 Display unit
14, 15 Operating elements
16 Engagement region
17, 18 Channel limb
20 Electrode
21 Finger
22 Detection region
23 Control unit
24 Door-opening device
25 Drive motor
26 Drive shaft
27 Motor support
28 Cam elements
29 Camway
30 Axial ball bearing
31 Switch
32 Transmission element
33 Plunger
34 Door hook
35 Rotary catch
36 Housing
37 Door device
38 Outer surface
39 Elevation
40 End
41 Upper side A, B, C Axes
α Angular region

The invention claimed is:

1. A door device for a domestic appliance, said door device comprising:
a door including a detection sensor configured to detect user contact and/or proximity in a detection region, the door comprising:
a front face;
a rear face opposing the front face; and
a plurality of side faces extending from the front face to the rear face;
a handle element positioned in a recessed area of one of: a vertical longitudinal side surface of the door; and a top surface of the door the plurality of side faces, the detection region being positioned in the handle element;
a door-opening device for automatic opening of the door; and
a control unit,
wherein the control unit is configured for controlling the door-opening device in response to information received from the detection sensor.

2. The door device of claim 1, wherein the plurality of side faces comprises opposing first and second vertical side surfaces of the door, a top surface of the door extending between the first and second vertical side surfaces and a bottom surface of the door extending between the first and second vertical side surfaces.

3. The door device of claim 2, wherein the door device further comprises a further handle element, the handle elements being arranged at one of the plurality of side faces.

4. The door device of claim 3, wherein the one of the first and second vertical side surfaces and the top surface each have a slit for arrangement of the handle elements.

5. The door device of claim 1, wherein the handle element is a bar which comprises an engagement region.

6. The door device of claim 5, wherein the engagement region is a corner-free channel.

7. The door device of claim 6, wherein the corner-free channel has a first channel limb facing a door front and a second channel limb facing away from the door front, said first channel limb being defined by a length which is longer than a length of the second channel limb.

8. The door device of claim 1, wherein the handle element is arranged behind a front panel of the door such that the handle element is concealed from the front face of the door.

9. The door device of claim 1, wherein the detection sensor is a capacitive sensor.

10. The door device of claim 1, wherein the detection sensor has an electrode arranged in the door behind the handle element.

11. The door device of claim 10, wherein the electrode is arranged at the handle element behind an engagement region.

12. The door device of claim 1, wherein the handle element is made, at least in a region of the detection sensor, from an electrically non-conductive material.

13. The door device of claim 1, wherein the door-opening device comprises a child safety device.

14. The door device of claim 1, wherein the door comprises an operating device provided at a front panel of the door.

15. The door device of claim 14, wherein the door-opening device comprises a child safety device, said control unit configured to electronically activate and deactivate the child safety device via the operating device.

16. The door device of claim 15, wherein the child safety device is configured to disable an automatic opening of the door due to the presence of an object in the detection region.

17. The door device of claim 14, wherein the operating device is configured to actuate the door-opening device.

18. The door device of claim 1, wherein the door-opening device comprises a door hook arranged at the door, a drive device provided separately from the door for linear actuation of the door hook, and a rotary catch arranged on a drive device side to allow unlocking of the door hook for opening the door.

19. The door device of claim 1, wherein a portion of the door is outside the immediate vicinity of the handle element.

20. The door device of claim 19, wherein the handle element is configured to facilitate manually opening the door.

21. A domestic appliance, comprising:
a door device having a door;
a handle element set within a recessed portion of: one of two vertical side surfaces of the door or a top surface of the door, wherein the top surface and the two vertical side surfaces extend away from a front face of the door;
a door-opening device for automatic opening of the door; and
a control unit;
wherein the door comprises at least one detection sensor integrated into the door, the at least one detection sensor being configured to detect user contact or proximity in a detection region located within said recessed portion; and
wherein the control unit is configured for controlling the door-opening device in response to information received from the detection sensor.

22. The domestic appliance of claim 21, constructed in the form of an oven.

23. The domestic appliance of claim 21, wherein the two vertical side surfaces are one of a first vertical longitudinal side surface or a second vertical longitudinal side surface arranged opposite the first vertical longitudinal side surface, and the top surface extends between the first and second vertical longitudinal side surfaces.

24. The domestic appliance of claim 21, wherein the two vertical side surfaces are one of a first vertical longitudinal side surface or a second vertical longitudinal side surface arranged opposite the first vertical longitudinal side surface, the top surface extends between the first and second longitudinal side surfaces, and the domestic appliance further comprises a further handle element, the handle element being arranged at one of: the first and second vertical longitudinal side surfaces or the top surface.

25. The domestic appliance of claim 24, wherein the one of said first and second vertical longitudinal side surfaces and the top side surface each have a slit for arrangement of the handle elements.

26. The domestic appliance of claim 21, wherein the handle element is a bar which comprises an engagement region.

27. The domestic appliance of claim 26, wherein the engagement region is a corner-free channel.

28. The domestic appliance of claim 27, wherein the corner-free channel has a first channel limb facing a door front and a second channel limb facing away from the door front, said first channel limb being defined by a length which is longer than a length of the second channel limb.

29. The domestic appliance of claim 21, wherein, when the handle element is arranged behind a front panel of the door such that the handle element is concealed from a front surface of the door.

30. The domestic appliance of claim 21, wherein the detection sensor is a capacitive sensor.

31. The domestic appliance of claim 21, wherein the detection sensor has an electrode arranged in the door behind the handle element.

32. The domestic appliance of claim 31, wherein the electrode is arranged at the handle element behind an engagement region.

33. The domestic appliance of claim 21, wherein the handle element is made, at least in a region of the detection sensor, from an electrically non-conductive material.

34. The domestic appliance of claim 21, wherein the door-opening device comprises a child safety device.

35. The domestic appliance of claim 21, wherein the door comprises an operating device provided at a front panel of the door.

36. The domestic appliance of claim 35, wherein the door-opening device comprises a child safety device, said control unit configured to electronically activate and deactivate the child safety device via the operating device.

37. The domestic appliance of claim 35, wherein the operating device is configured to actuate the door-opening device.

38. The domestic appliance of claim 21, wherein the door-opening device comprises a door hook arranged at the door, a drive device provided separately from the door for linear actuation of the door hook, and a rotary catch arranged on a drive device side to allow unlocking of the door hook for opening the door.

39. The domestic appliance of claim 21, wherein the detection region is positioned at or adjacent to the handle element.

40. A method for actuating a door of a door device for a domestic appliance, comprising:
detecting a user contact and/or proximity in a detection region by at least one detection sensor integrated into the door, the detection region being located within a recessed area of: one of two vertical longitudinal side surfaces of the door or a top surface of the door, wherein the top surface and the two vertical side surfaces extend away from a front face of the door; and
controlling an opening of the door of the door device by a control unit in response to information received from the at least one detection sensor.

41. The method of claim 40, wherein the detection region is within an immediate vicinity of a handle element of the door device or at the handle element.

42. The method of claim 41, wherein the handle element is positioned within the recessed area.

43. The method of claim 42, wherein a portion of the door is outside the immediate vicinity of the handle element.

* * * * *